(12) United States Patent
Wang et al.

(10) Patent No.: US 12,431,376 B2
(45) Date of Patent: Sep. 30, 2025

(54) SEMICONDUCTOR PROCESS CHAMBER, SEMICONDUCTOR PROCESS EQUIPMENT, AND SEMICONDUCTOR PROCESS METHOD

(71) Applicant: BEIJING NAURA MICROELECTRONICS EQUIPMENT CO., LTD., Beijing (CN)

(72) Inventors: Yongfei Wang, Beijing (CN); Qing She, Beijing (CN); Yunfeng Lan, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 10 days.

(21) Appl. No.: 18/687,217

(22) PCT Filed: Aug. 29, 2022

(86) PCT No.: PCT/CN2022/115371
§ 371 (c)(1),
(2) Date: Feb. 27, 2024

(87) PCT Pub. No.: WO2023/030214
PCT Pub. Date: Mar. 9, 2023

(65) Prior Publication Data
US 2024/0371672 A1  Nov. 7, 2024

(30) Foreign Application Priority Data

Aug. 31, 2021 (CN) .......................... 202111014254.5

(51) Int. Cl.
*H01L 21/677* (2006.01)
*C23C 16/44* (2006.01)
(Continued)

(52) U.S. Cl.
CPC .... *H01L 21/67751* (2013.01); *C23C 16/4408* (2013.01); *C23C 16/4409* (2013.01); *H01L 21/67196* (2013.01); *H01L 21/68742* (2013.01)

(58) Field of Classification Search
CPC ................................................ H01L 21/67751
See application file for complete search history.

(56) References Cited

U.S. PATENT DOCUMENTS 7,267,725 B2 * 9/2007 Kawano .................. C23C 16/54
156/345.31
11,955,355 B2 * 4/2024 Savandaiah ....... H01L 21/67751

FOREIGN PATENT DOCUMENTS

| CN | 104103549 A | 10/2014 |
| CN | 105734520 A | 7/2016 |

(Continued)

OTHER PUBLICATIONS

The World Intellectual Property Organization (WIPO) International Search Report for PCT/CN2022/115371 Oct. 26, 2022 8 Pages (including translation).

*Primary Examiner* — Mark C Hageman
(74) *Attorney, Agent, or Firm* — ANOVA LAW GROUP, PLLC

(57) ABSTRACT

A semiconductor process chamber includes: a reaction chamber; a transfer chamber below the reaction chamber connected to the transfer chamber through a bottom opening; a base with a lifting shaft connected to a bottom of the base, where the base is able to rise and descend between the reaction chamber and the transfer chamber through the bottom opening; and an elastic annular sealing structure. The annular sealing structure is below the base and surrounding the lifting shaft of the base. When the base descends into the transfer chamber, the base presses down and compress the annular sealing structure; and when the base rises into the (Continued)

reaction chamber and pressure on the annular sealing structure is released, the annular sealing structure stretches until it abuts a bottom wall of the reaction chamber. to seal the bottom opening.

11 Claims, 6 Drawing Sheets

(51) Int. Cl.
*H01L 21/67* (2006.01)
*H01L 21/687* (2006.01)

(56) References Cited

FOREIGN PATENT DOCUMENTS

| | | | |
|---|---|---|---|
| CN | 106206399 | A | 12/2016 |
| CN | 110911338 | A | 3/2020 |
| CN | 111501000 | A | 8/2020 |
| CN | 113718229 | A | 11/2021 |
| JP | 2006066457 | A | 3/2006 |
| TW | 201906064 | A | 2/2019 |
| TW | 202002098 | A | 1/2020 |

\* cited by examiner

SEMICONDUCTOR PROCESS CHAMBER, SEMICONDUCTOR PROCESS EQUIPMENT, AND SEMICONDUCTOR PROCESS METHOD

CROSS-REFERENCE TO RELATED APPLICATION

This application is a national phase entry under 35 U.S.C § 371 of International Application No. PCT/CN2022/115371, filed on Aug. 29, 2022, which claims the priority to Chinese Patent Application No. 20111014254.5, filed on Aug. 31, 2021, the content of all of which is incorporated herein by reference in their entirety.

TECHNICAL FIELD

The present disclosure generally relates to the field of semiconductor process equipment technology and, more particularly, relates to a semiconductor process chamber, semiconductor process equipment including a semiconductor process chamber, and a semiconductor process method.

BACKGROUND

With the popularization and upgrading of electronic products and the promotion of the international situation, the semiconductor industry has evolved rapidly, especially for very large-scale integrated circuits. Each foundry urgently needs an optimal production expansion plan, that is, maximizing the ratio of production capacity to floor space. At this stage, there are two main solutions to increase production capacity. The first solution is to increase the film formation rate, that is, increase the number of substrates where films are formed per unit time. The second solution is to increase the number of substrates where films are formed at the same time.

However, increasing the production capacity of existing single-wafer process chambers can increase the film formation rate, but increasing the yield by increasing the film formation rate is limited. In contrast, large-capacity multi-reaction-zone chamber equipment have obvious advantages. Its key technology is the independence of each reaction zone, that is, isolation through isolation and sealing structures to achieve the independence of each reaction zone. In chemical vapor deposition (CVD) and atomic layer deposition (ALD) process equipment, for example, the isolation and sealing structure can ensure that the airflow field in each reaction zone is stable and uniform, further ensuring the stability and uniformity of film formation. However, because of the limitations of the wafer transfer structure of the large-capacity multi-reaction-zone chamber equipment, the reaction zones are interconnected, and the internal space of the transfer chamber is large and the air flow is irregular, which cannot ensure smooth and uniform air flow. Therefore, the pressure control during the process is unstable, which ultimately affects the film quality.

SUMMARY

The present disclosure provides a semiconductor process chamber, semiconductor process equipment, and a semiconductor process method. The semiconductor process chamber in the present disclosure may improve the pressure control effect in the reaction chambers, improve the process effect of the semiconductor process, shorten the wafer transfer time, and improve the film formation efficiency of the semiconductor process.

To solve the above technical problems, the present disclosure provides a semiconductor process chamber. The semiconductor process chamber includes: a reaction chamber; a transfer chamber located below the reaction chamber, where the reaction chamber is connected to the transfer chamber through a bottom opening; a base with a lifting shaft connected to a bottom of the base, where the base is able to rise and descend between the reaction chamber and the transfer chamber through the bottom opening; and an elastic annular sealing structure. The annular sealing structure is disposed below the base and surrounding the lifting shaft of the base. When the base descends into the transfer chamber, the base presses down the annular sealing structure to compress the annular sealing structure; and when the base rises into the reaction chamber and pressure exerted on the annular sealing structure is released, the annular sealing structure stretches under its own elastic force until it abuts against a bottom wall of the reaction chamber. to seal the bottom opening.

Optionally, the annular sealing structure includes a sealing ring and a first elastic sealing cylinder. A top end of the first elastic sealing cylinder is sealingly connected to a bottom wall of the sealing ring. A bottom end of the first elastic sealing cylinder is sealingly connected to the bottom wall of the transfer chamber. When the first elastic sealing cylinder stretches, the top wall of the sealing ring abuts against the bottom wall of the reaction chamber to seal the bottom opening. A bottom end of the lifting shaft passes through a through hole provided at the bottom of the transfer chamber and extends to the outside of the transfer chamber. The bottom end of the first elastic sealing cylinder surrounds the through hole for sealing the through hole.

Optionally, the first elastic sealing cylinder is a bellows.

Optionally, the bottom end of the first elastic sealing cylinder is provided with a connecting flange. A first annular receiving groove surrounding the through hole is formed on the bottom wall of the transfer chamber. The connecting flange is disposed in the first annular receiving groove; and a first sealing member is provided between two opposite surfaces of the connecting flange and the first annular receiving groove.

Optionally, the sealing ring includes a concave plate and a concave plate flange. The concave plate flange is arranged around the concave plate and fixedly connected to an outer edge of the concave plate. The concave plate flange is used to abut against the bottom wall of the reaction chamber; and a side of the concave plate facing the reaction chamber is provided with a receiving groove for accommodating the base when the base is lowered.

Optionally, the bottom wall of the reaction chamber is provided with a second annular receiving groove surrounding the bottom opening. The second annular receiving groove is used to accommodate the concave plate flange; and a second seal member is disposed between two opposite surfaces of the concave plate flange and the second annular receiving groove.

Optionally, the base includes a plurality of base holes distributed at intervals along a circumferential direction of the base. A plurality of support pillars is disposed in the plurality of base holes in one-to-one correspondence. A limiting structure is formed between each base hole and one corresponding support pillar. The limiting structure is used to make the support pillar rise together with the base when the base rises to a position where the top of the support pillar is not higher than the bearing surface of the base. When the base descends, the support pillar stops descending after its bottom end contacts the bottom wall of the transfer chamber, such that the top end of the support pillar is higher than the bearing surface of the base. The annular sealing structure surrounds the outside of the plurality of support pillars.

Optionally, the semiconductor process chamber includes a plurality of the reaction chambers. Each reaction chamber includes one corresponding bottom opening. The semiconductor process chamber includes a plurality of the bases whose number is same as the number of the plurality of the reaction chambers, and the plurality of the bases and the plurality of the reaction chambers are disposed in one-to-one correspondence; and a transfer manipulator is provided in the transfer chamber to transfer wafers between bases corresponding to different reaction chambers.

Optionally, the plurality of the reaction chambers are arranged around the transfer manipulator. The transfer manipulator includes a driving assembly, an upper flange and transfer fingers fixedly provided on the upper flange. The driving assembly is used to drive the upper flange and the transfer fingers fixed on the upper flange to lift or rotate, such that the transfer fingers are able to remove wafers on a portion of the plurality of bases and place the wafers on another portion of the plurality of bases.

Optionally, the semiconductor process chamber further includes a purging device. The purging device is used to introduce a purge gas into the first elastic sealing cylinder through the through hole at the bottom of the transfer chamber.

Another aspect of the present disclosure also provides semiconductor process equipment. The semiconductor process equipment includes any semiconductor process chamber provided by the present disclosure.

Another aspect of the present disclosure also provides a semiconductor process method. The semiconductor method is applied to a semiconductor process equipment provided by the present disclosure, and includes: placing a pre-process wafer on a base in a transfer chamber; controlling the base to rise into a reaction chamber, where an annular sealing structure seals a bottom opening of the reaction chamber; performing a semiconductor process; controlling the base to descend into the transfer chamber; and removing the post-process wafer on the base.

Optionally, the semiconductor process equipment includes a plurality of reaction chambers. Each reaction chamber includes a bottom opening. The semiconductor process equipment includes a plurality of bases whose number same as the number of the plurality of the reaction chambers, and the plurality of the bases and the plurality of the reaction chambers are disposed in one-to-one correspondence. A transfer manipulator is provided in the transfer chamber to transfer wafers between bases corresponding to different reaction chambers. Placing the pre-process wafer on the base in the transfer chamber includes: placing pre-process wafers on a portion of the plurality of bases; controlling the transfer manipulator to transfer the pre-process wafers on the portion of the plurality of bases to another portion of the plurality of bases; and placing pre-process wafers on the portion of the plurality of bases again. Removing the post-process wafer on the base includes: removing post-process wafers on a portion of the plurality of bases; controlling the transfer manipulator to transfer the post-process wafers on another portion of the plurality of bases to the portion of the plurality of bases; and removing the post-process wafers on the portion of the plurality of bases again.

Optionally, the plurality of reaction chambers are arranged around the transfer manipulator The transfer manipulator includes a driving assembly, an upper flange and transfer fingers fixedly provided on the upper flange The driving assembly is used to drive the upper flange and the transfer fingers fixed on the upper flange to lift or rotate, such that the transfer fingers are able to remove wafers on a portion of the plurality of bases and place the wafers on another portion of the plurality of bases. Controlling the transfer manipulator to transfer the pro-process wafers on the portion of the plurality of bases to the another portion of the plurality of bases includes: controlling the driving component to drive the upper flange to rise or descend, such that the height of the transfer fingers rises or descends between the pre-process wafers and the bearing surface of the plurality of bases; controlling the driving component to drive the upper flange to rotate, such that at least a portion of the transfer fingers rotates to positions below the pre-process wafers on the portion of the plurality of bases, and controlling the driving assembly to drive the upper flange to rise, such that the transfer fingers remove the pre-process wafers on the portion of the plurality of bases; control the driving assembly to drive the upper flange to rotate such that the pre-process wafers carried on the transfer fingers are rotated to positions above the another portion of the plurality of bases, and controlling the driving component to drive the upper flange to descend, such that the transfer fingers place the pre-process wafers on the another portion of the plurality of bases; and controlling the drive component to drive the upper flange to rotate, such that the transfer fingers leave the plurality of bases. Controlling the transfer manipulator to transfer the post-process wafers on the another portion of the plurality of bases to the portion of the plurality of bases includes: controlling the driving component to drive the upper flange to rise or descend, such that the height of the transfer fingers rises or descends between the post-process wafers and the bearing surface of the plurality of bases; controlling the driving component to drive the upper flange to rotate, such that at least a portion of the transfer fingers rotates to positions below the post-process wafers on the another portion of the plurality of bases, and controlling the driving assembly to drive the upper flange to rise, such that the transfer fingers remove the post-process wafers on the another portion of the plurality of bases; control the driving assembly to drive the upper flange to rotate such that the post-process wafers carried on the transfer fingers are rotated to positions above the portion of the plurality of bases, and controlling the driving component to drive the upper flange to descend, such that the transfer fingers place the post-process wafers on the portion of the plurality of bases; and controlling the drive component to drive the upper flange to rotate, such that the transfer fingers leave the plurality of bases.

In the present disclosure, the elastic annular sealing structure may be disposed in the semiconductor process chamber. The annular sealing structure may be disposed below the base and surround the lifting shaft of the base, to partition and seal the transfer chamber. Therefore, the external space and external environment located outside the annular sealing structure may be isolated from the space inside the annular sealing structure, thereby ensuring the sealing of the space under the base in the transfer chamber. Moreover, when the base descends to the transfer chamber, the base may press down the annular sealing structure to compress it, thereby ensuring that the annular sealing structure will not affect the descending movement of the base. When the base rises to the reaction chamber and the pressure exerted on the annular sealing structure is released, the annular sealing structure may stretch under the action of its own elastic force until it abuts the bottom wall of the reaction chamber to seal the bottom opening of the reaction chamber. At this time, the annular sealing structure may isolate the reaction chamber from the external space outside the annular sealing structure in the transfer chamber, thereby improving the sealing effect of the reaction chamber, improving the pressure control effect of the reaction chamber, and improving the process effect of the semiconductor process. Further, there may be a strict isolation between devices such as manipulators in the sealing cylinder external space of the transfer chamber and the reaction chamber. Therefore, the sealing cylinder external space may be able to be evacuated while the semiconductor process is being carried out in the reaction chamber, and there may be no need to evacuate the transfer chamber to the background vacuum again during the wafer transfer step between different semiconductor processes. The wafer transfer time may be shortened, thereby improving the film forming efficiency of the semiconductor process and increasing the machine productivity. Also, the semiconductor process chamber structure provided by the present disclosure may be particularly suitable for a multi-reaction-zone chamber (that is, there are multiple reaction chambers). The plurality of reaction chambers may be strictly sealed through the annular sealing structure, thereby solving the problem of mutual gas flow interference between the various reaction zones in the multi-reaction-zone chamber and improving the film formation quality of the multi-reaction-zone chamber.

BRIEF DESCRIPTION OF THE DRAWINGS

The accompanying drawings are used to provide a further understanding of the present disclosure and form a part of the specification. They are used to explain the present disclosure together with the following specific embodiments, but do not constitute a limitation of the present disclosure.

DETAILED DESCRIPTION

The present disclosure will be described with reference to the drawings. It should be understood that the various embodiments described in the present disclosure are used only as examples to illustrate the present disclosure, and do not limit the scope of the present disclosure.

Figure 1:
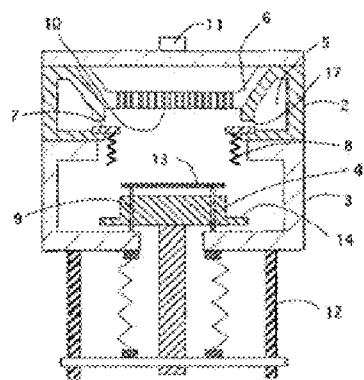
FIG. 1 illustrates a structure of a single process chamber in multi-reaction-zone chamber equipment in existing technologies.
Figure 2:
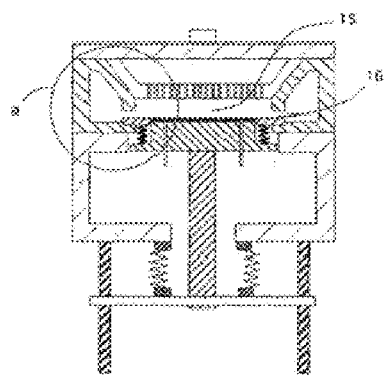
FIG. 2 illustrates another state of the process chamber in FIG. 1.
Figure 3:
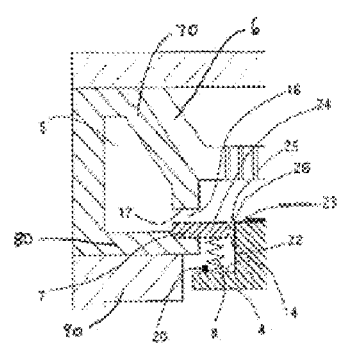
FIG. 3 illustrates a partially enlarged view of the process chamber in FIG. 2.

FIG. 1 to FIG. 3 are schematic structural diagrams of a single process chamber of large-capacity multi-reaction-zone chamber equipment in existing technologies. FIG. 1 illustrates a state when a base 4 is lowered to a wafer pick-and-place position, and FIG. 2 illustrates a reaction state when the base 4 is raised to an opening of a partition plate 7 and makes a reaction zone sealed (actually not completely sealed, see below).

As shown in FIG. 1 and FIG. 2, after loading a wafer 13 on a substrate lifting pin 9, the base 4 rises. At this time, the substrate lifting pin 9 (pin) still stays in the original position under the action of gravity (there is a gap between the substrate lifting pin 9 and a hole in the base 4 that accommodates the substrate lifting pin 9). When the upper end conical surface of the substrate lifting pin 9 contacts the base 4, the conical surface of the substrate lifting pin 9 has contacted the conical surface at the upper end of the base 4 hole. As the base 4 continues to rise, the flat surface 14 of the base 4 contacts the lower end surface of the bellows 8 to compress the bellows 8, thereby achieving a sealing effect and separating the upper reaction zone from the lower transfer zone.

However, at this time, the upper reaction zone and the lower transfer zone are still connected through the gap between the substrate lifting pin 9 and the hole. This affects the pressure control effect of the reaction zone. Also, the gas in the reaction zone will flow under the wafer 13 and flow into the gap between the substrate lift pin 9 and the hole, and further enter the lower transfer zone where the gas reacts to form particles. When the base 4 is lowered or transferred, particles will fall onto the upper surface of the wafer 13 and cause contamination. During the process, the process gas will also enter the space indicated by 22 from the gap 25, where films and particles will be formed. When the base 4 is lowered, these particles will also fall on the upper surface of the wafer 13 and cause contamination. Further, since the base 4 needs to pass through the bellows 8 and the bellows has a corrugated width, the corrugated width of the bellows also needs to occupy some lateral space, thereby increasing the floor space of the chamber.

Figure 4:
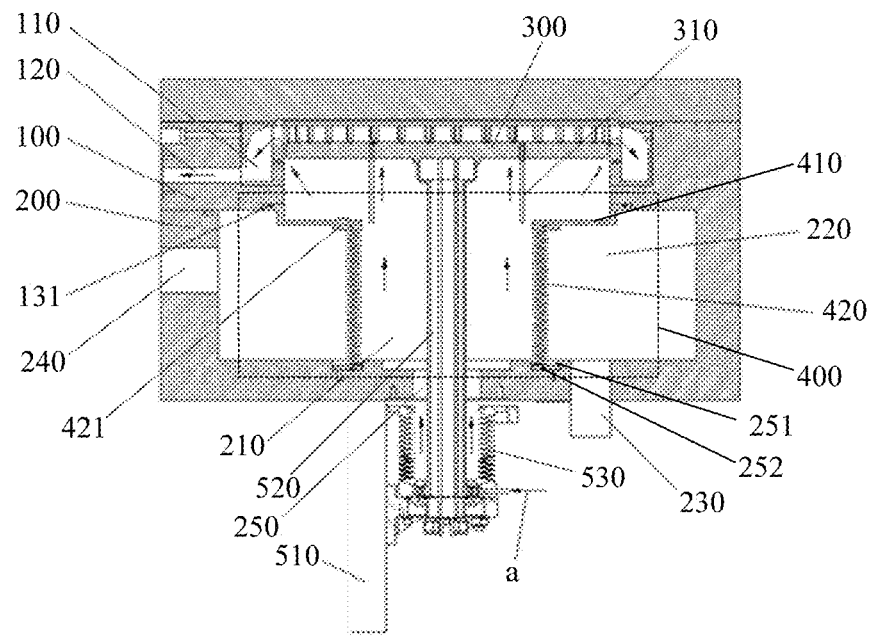
FIG. 4 illustrates an exemplary structure of a semiconductor process chamber according to various disclosed embodiments of the present disclosure.

One aspect of the present disclosure provides a semiconductor process chamber to at least partially alleviate the above problem. As shown in FIG. 4, in one embodiment, the semiconductor process chamber may include a reaction chamber 100 and a transfer chamber 200 located below the reaction chamber 100. The reaction chamber 100 may be connected to the transfer chamber 200 through a bottom opening. A base 300 may be provided in the semiconductor process chamber. A lifting shaft 520 may be connected to the bottom of the base 300 such that the base is able to rise and descend between the reaction chamber 100 and the transfer chamber 200 through the bottom opening of the reaction chamber 100. Further, an elastic annular sealing structure 400 may be also provided in the semiconductor process chamber. The annular sealing structure 400 may be disposed below the base 300 and surround the lifting shaft 520 of the base 300 for isolating the external space outside the annular sealing structure 400 and the external environment from the space inside the annular sealing structure, thereby ensuring the sealing of the space under the base in the transfer chamber 200.

During the process of the base 300 descending to the transfer chamber 200, the base 300 may press down the annular sealing structure 400 to compress it, thereby ensuring that the annular sealing structure will not affect the descending movement of the base. When the base 300 rises to the reaction chamber 300 and releases the pressure exerted on the annular sealing structure 400, the annular sealing structure 400 may elongate under its own elastic force until it collides with the bottom wall of the reaction chamber 100, to seal the bottom opening of the reaction chamber 100. At this time, the annular sealing structure 400 may be able to isolate the reaction chamber 100 from the external space outside the annular sealing structure 400 in the transfer chamber 200, thereby improving the sealing effect of the reaction chamber, improving the pressure control effect of the reaction chamber, and improving the semiconductor process effect. Also, a strict isolation and sealing relationship may be established between manipulators or other devices in the external space outside the annular sealing structure and the reaction chamber. Therefore, when the semiconductor process is performed in the reaction chamber 100, the above-mentioned external space may be evacuated to the vacuum at the same time, eliminating the need to evacuate the transfer chamber to the background vacuum again during the wafer transfer between semiconductor processes. The wafer transfer time may be shortened, thereby improving the film forming efficiency of the semiconductor process and increasing the machine productivity.

Further, the semiconductor process chamber provided by the present disclosure is particularly suitable for a multi-reaction-zone chamber, that is, a chamber with multiple reaction chambers. Since each reaction chamber may be strictly sealed by an annular sealing structure, mutual interference of gas flows between reaction zones in the multi-reaction-zone chamber in existing technologies may be avoided, improving the film-forming quality of the multi-reaction-zone chamber.

In various embodiments, the annular sealing structure 400 may have various structures. For example, in one embodiment, the annular sealing structure 400 may include a sealing ring 410 and a first elastic sealing cylinder 420. The sealing ring 410 and the first elastic sealing cylinder 420 may be both disposed below the base 300 and sleeved on the lifting shaft 520 of the base 300. A top end of the first elastic sealing cylinder 420 may be sealed and connected to the bottom wall of the sealing ring 410, and the connection location may be, for example, at the inner periphery of the sealing ring 410. A bottom end of the first elastic sealing cylinder 420 may be sealingly connected with the bottom wall of the transfer chamber 200. A bottom end of the lifting shaft 520 may pass through a through hole 250 provided at the bottom of the transfer chamber 200 and extend to the outside of the transfer chamber 200. The bottom end of the first elastic sealing cylinder 420 may surround the through hole 250 for sealing the through hole 250.

Since the first elastic sealing cylinder 420 has elasticity, the first elastic sealing cylinder 420 may be in a compressed state when the base 300 is located in the transfer chamber 200. When the base 300 rises to the reaction chamber 100 and releases the pressure exerted on the first elastic sealing cylinder 420, the first elastic sealing cylinder 420 may drive the sealing ring 410 to rise (that is, to extend) through its own elastic force. When the first elastic sealing cylinder 420 rises, the top wall of the sealing ring 410 may abut against the bottom wall of the reaction chamber 100 to close the bottom opening of the reaction chamber 100. Under the action of its elastic force, the first elastic sealing cylinder 420 may press the sealing ring 410 against the bottom wall of the reaction chamber 100, thereby ensuring the sealing effect.

In one embodiment, the first elastic sealing cylinder 420 may be a bellows. In the present disclosure, the first elastic sealing cylinder 420 may be able to drive sealing ring 410 to rise through the elastic force. When the height of the base 300 decreases, the base 300 may press down the sealing ring 410 and compress the first elastic sealing cylinder 420. After a pre-process wafer is placed on the base 300, the height of the base 300 may rise and the base 300 may enter the reaction chamber 100. The first elastic sealing cylinder 420 may lift up the sealing ring 410 to seal the bottom opening of the reaction chamber 100. At this time, the first elastic sealing cylinder 420 may partition the transfer chamber 200 into a sealing cylinder internal space 210 and a sealing cylinder external space 220. There may be no airtightness defect in the sealing ring 410 and the first elastic sealing cylinder 420 (for example, a gap between the substrate lifting pin 9 and the hole in the base 4). Therefore, the sealing cylinder internal space 210 may be isolated from the sealing cylinder external space 220 and devices such as manipulators in the sealing cylinder external space 220. Therefore, when process gases are introduced into the reaction chamber 100 and the semiconductor process is conducted, the process gases in the reaction chamber 100 may not leak to the sealing cylinder external space 220 because of the pressure difference between the reaction chamber 100 and the sealing cylinder external space 200, thereby improving the pressure control effect of the reaction chamber 100.

In the present disclosure, the sealing ring 410 and the first elastic sealing cylinder 420 may isolate the reaction chamber 100 and the sealing cylinder internal space 210 from the sealing cylinder external space 220, thereby improving the sealing effect of the reaction chamber 100 and improving the pressure control effect of the reaction chamber 100. The process effect of the semiconductor process may be also improved.

Further, to ensure the cleanliness of the wafer surface, the transfer chamber 200 may need to be evacuated before each wafer transfer. In the present disclosure, there may be strict isolation between devices such as manipulators in the sealing cylinder external space 220 and the reaction chamber 100. Therefore, the sealing cylinder external space 220 may be able to be evacuated while the semiconductor process is being carried out in the reaction chamber 100, and there may be no need to evacuate the transfer chamber 200 to the background vacuum again during the wafer transfer between different semiconductor processes. The wafer transfer time may be shortened, thereby improving the film forming efficiency of the semiconductor process and increasing the machine productivity.

Figure 5:
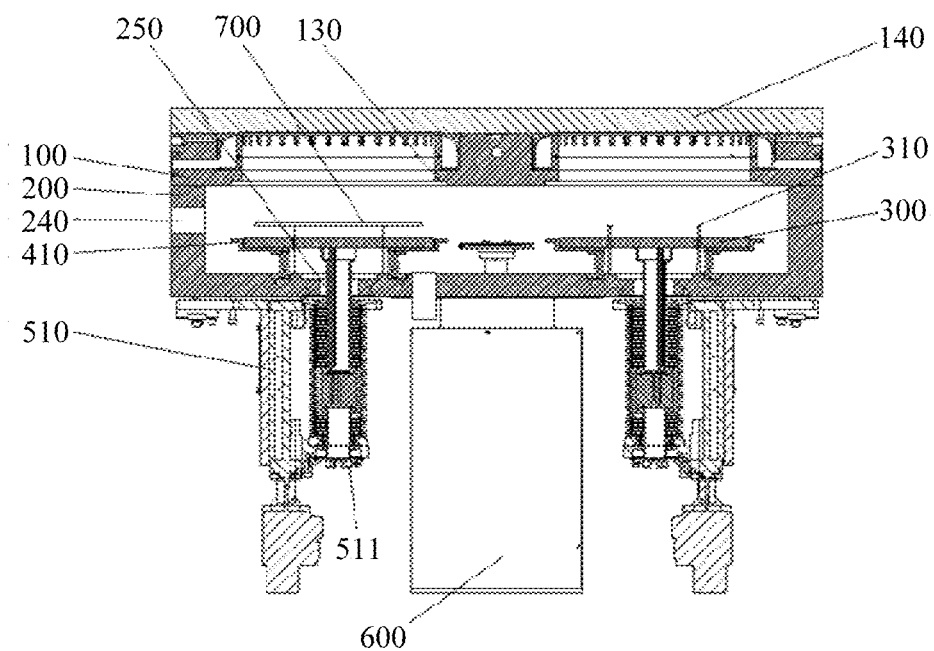
FIG. 5 illustrates another exemplary structure of a semiconductor process chamber according to various disclosed embodiments of the present disclosure.

Also, the semiconductor process chamber structure provided by the present disclosure may be particularly suitable for a multi-reaction-zone chamber (that is, there are multiple reaction chambers 100 in a same semiconductor process chamber, and the multiple reaction chambers 100 are connected to the same transfer chamber 200 below). As shown in FIG. 5, the sealing ring 410 and the first elastic sealing cylinder 420 may strictly seal the reaction chamber 100, thereby solving the problem of mutual gas flow interference between the various reaction zones (reaction chambers) in the multi-reaction-zone chamber and improving the film formation quality of the multi-reaction-zone chamber.

The reaction type of the semiconductor process performed in the semiconductor process chamber is not limited in the present disclosure. For example, in various embodiments, the semiconductor process chamber may be a chemical vapor deposition (CVD) chamber, or an atomic layer deposition (ALD) chamber.

In one embodiment shown in FIG. 4, the outer diameter of the first elastic sealing cylinder 420 may be smaller than the outer diameter of the base 300, such that the chamber size is not additionally increased. Therefore, the floor space of each process chamber may be reduced, and the utilization rate of the machine space may be improved.

To improve the connection strength and the convenience of disassembly and assembly between the two ends of the first elastic sealing cylinder 420, the sealing ring 410 and the bottom wall of the transfer chamber 200, in one embodiment, as shown in FIG. 4, the bottom end of the first elastic sealing cylinder 420 may be provided with a connecting flange 421. A first annular receiving groove 251 may be provided on the bottom wall of the transfer chamber 200 around the through hole 250. The connecting flange 421 may be disposed in the first annular receiving groove 251. A first seal member 252 may be provided between two opposite surfaces of the connecting flange 421 and the first annular receiving groove 251 for sealing the gap between the connecting flange 421 and the first annular receiving groove 251 and thereby sealing the through hole 250. Therefore, the external space and external environment of the transfer chamber 200 located outside the annular sealing structure 400 may be isolated from the inner space of the annular sealing structure 400.

To improve the air tightness, in one embodiment, both the bottom end and the top end of the first elastic sealing cylinder 420 may be provided with connecting flanges 421, and the first elastic sealing cylinder 420 may be connected to the connecting flanges 421 at the bottom end and the top end respectively by welding. The bottom end and the top end of the first elastic sealing cylinder 420 may be tightly connected to other components through the connecting flanges 421, thereby improving the connection strength of the two ends of the first elastic sealing cylinder 420 and also improving the disassembly and assembly efficiency when performing maintenance on the first elastic sealing cylinder 420 and internal components. Further, a first annular receiving groove 251 may be formed on the bottom wall of the transfer chamber 200 to accommodate the connecting flange 421 at the bottom end of the first elastic sealing cylinder 420, which improves the positioning accuracy of the horizontal position of the first elastic sealing cylinder 420.

The present disclosure does not specifically limit other structures on the base 300. For example, in one embodiment, the base 300 may include support pillars for lifting the wafer. As shown in FIG. 4, the base 300 may be provided with a plurality of base holes (more than or equal to 3) distributed at intervals along the circumference of the base 300, and a plurality of support pillars 310 may be disposed in the plurality of base holes in one-to-one correspondence. Further, a limiting structure may be formed between each base hole and one corresponding support pillar 310. This limiting structure may be used to drive the plurality of support pillars 310 to rise with the base 300 when the base 300 rises to a position where the top end of the plurality of support pillars 310 is not higher than the bearing surface of the base 300. When the base 300 descends, the plurality of support pillars 310 may stop descending after the bottom end of the plurality of support pillars 310 contacts the bottom wall of the transfer chamber 200, such that the top end of the plurality of support pillars 310 is higher than the bearing surface of the base 300. The annular sealing structure 400 may surround the outside of the plurality of support pillars 310, that is, the plurality of support pillars 310 may be located in the space enclosed by the annular sealing structure 400.

In various embodiments of the present disclosure, the above-mentioned limiting structure may have a variety of structures. For example, in one embodiment, the limiting structure may include an inverted cone section (whose diameter gradually decreases from the top downward) provided on the top of the support pillar 310, and an inverted cone surface at the top of the base hole matching the inverted cone section. When the base 300 is in a low position, the bottom end of the support pillar 310 may abut against the bottom surface of the transfer chamber 200. At this time, the upper end surface of the support pillar 310 may be higher than the upper end surface of the base, thereby leaving enough space for transferring the wafer. When the base 300 rises, the support pillar 310 may not rise because of the gravity. When the inverted cone section at the upper end of the support pillar 310 contacts the inverse cone surface of the base hole, the support force of the inverse cone surface may offset the gravity of the support pillar 310 and the support pillar 310 may rise to the process position with the base 300.

To avoid air leakage caused by the gap between the support pillar 310 and the base hole and achieve strict sealing, as shown in FIG. 4, in one embodiment, the first elastic sealing cylinder 420 may surround the outside of the plurality of support pillars 310, that is, the inner diameter of the first elastic sealing cylinder 420 may be larger than the index circle where the plurality of base holes are located uniformly in the circumferential direction of the base.

Figure 8:
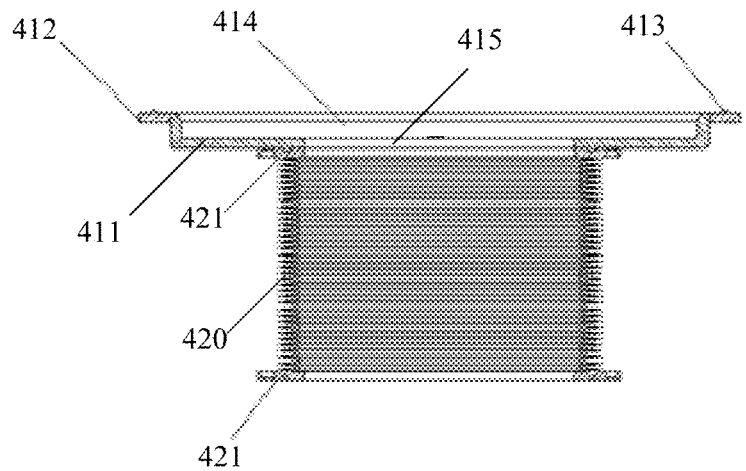
FIG. 8 illustrates an exemplary structure of a sealing ring and a first elastic sealing cylinder, according to various disclosed embodiments of the present disclosure.

To improve the stability of the sealing ring 410 and the base 300 when the base 300 presses down the sealing ring 401, in one embodiment, as shown in FIG. 8, the sealing ring 410 may include a concave plate 411 and a concave plate flange 412. The concave plate flange 412 may be arranged around the concave plate 411 and may be fixedly connected to the outer edge of the concave plate 411 for contacting the bottom wall of the reaction chamber 100. The concave plate 411 may be provided with a receiving groove 414 on one side facing the reaction chamber 100, for accommodating the base 300 when the base 300 is lowered to the bottom of the reaction chamber 100. An inner hole 415 of the sealing ring 410 may be formed at the center of the receiving groove 414 of the sealing ring 410.

In the present embodiment, the receiving groove 414 may be disposed on the surface of the sealing ring 410 corresponding to the position and size of the base 300 (projection on the horizontal plane). When the base 300 is lowered, the base 300 may first fall into the receiving groove 414, and then may press down the bottom surface of the receiving groove 414. Such that the sealing ring 410 and the first elastic sealing cylinder 420 are both pressed down. Similarly, before the base 300 rises and enters the reaction chamber 100, the sealing ring 410 may contact the base 300 under the lifting force of the first elastic sealing cylinder 420 to keep the base 300 in the receiving groove 414, thereby maintaining the stability of the relative position between the sealing ring 410 and the base 300 through the side walls of the receiving groove 414 and improving the smoothness of wafer transfer. Further, the relative position between the sealing ring 410 and the bottom opening of the reaction chamber 100 may be ensured when the sealing ring 410 rises to contact the bottom of the reaction chamber 100, thereby ensuring the sealing effect of the reaction chamber 100 by the sealing ring 410 and the first elastic sealing cylinder 420.

To prevent the connecting flanges 421 from affecting the structure on the top functional layer of the base 300, in one embodiment, the depth of the receiving groove 414 on the sealing ring 410 may be smaller than the thickness of a heating plate at the bottom of the base 300.

To further ensure the sealing effect of the reaction chamber 100, in one embodiment, as shown in FIG. 4 and FIG. 5, the bottom of the reaction chamber 100 (on the top wall of the transfer chamber 200) may be provided with a second annular receiving groove 130 surrounding the bottom opening of the reaction chamber 100. The second annular receiving groove 130 may be used to receive the concave plate flange 412. A second seal member 131 may be provided between two opposite surfaces of the concave plate flange 412 and the second annular receiving groove 130 for sealing the gap between the concave plate flange 412 and the second annular receiving groove 130, such that the bottom opening of the reaction chamber 100 is sealed when the top wall of the seal ring 410 abuts against the bottom wall of the reaction chamber 100.

In the present embodiment, the bottom wall of the reaction chamber 100 may be provided with the above-mentioned second annular receiving groove 130. After the sealing ring 410 rises, the concave plate flange 412 may vertically enter the second annular receiving groove 130. Therefore, the degree of freedom of the seal ring 410 in the horizontal direction may be further limited through the cooperation of the concave plate flange 412 and the second annular receiving groove 130, such that the sealing ring 410 is only able to move in the up and down direction relative to the reaction chamber 100, further ensuring the sealing effect of the reaction chamber 100 by the sealing ring 410 and the elastic sealing cylinder 420.

It should be noted that a distance between the bottom surface of the transfer chamber 200 and the bottom surface of the second annular receiving groove 130 may be smaller than a free length of the first elastic sealing cylinder 420. That is, the first elastic sealing cylinder 420 may be always in a compressed state, to ensure the sealing effect.

Figure 6:
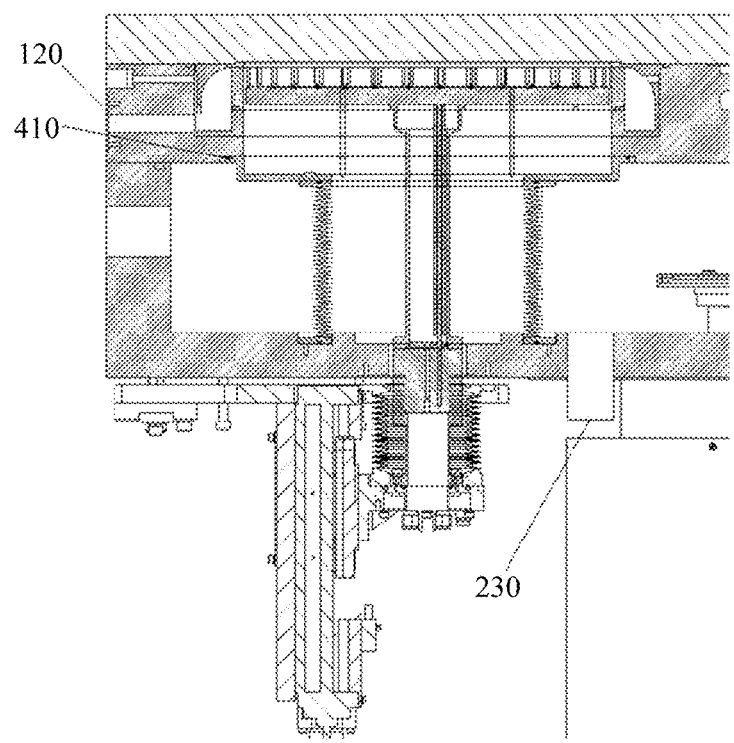
FIG. 6 illustrates a partially enlarged view of the semiconductor process chamber in FIG. 5, according to various disclosed embodiments of the present disclosure.

To further improve the sealing effect of the sealing ring 410 and the first elastic sealing cylinder 420 on the reaction chamber 100, in one embodiment, as shown in FIG. 4, FIG. 6, and FIG. 8, a protrusion 413 extending along a circumferential direction of the concave plate 411 on the top of the concave plate flange 412, and a groove structure corresponding to the position and shape (projection on the horizontal plane) may be formed on the bottom surface of the second annular receiving groove 130. Therefore, the width of the gap between the concave plate flange 412 and the second annular receiving groove 130 may be extended, further improving the airtightness of the concave plate flange 412 in sealing the bottom opening of the reaction chamber 100.

The present disclosure does not specifically limit the outer contour shapes of the concave plate flange 412 and the second annular receiving groove 130 and the pattern shape of the protrusion 413. For example, in some embodiments, the outer contours of the concave plate flange 412 and the second annular receiving groove 130 and the shape and pattern shape of the protrusion 413 may be a triangle (or approximately a triangle), a square (or an approximately square), or a regular polygon (or an approximately regular polygon) with more sides, etc. Preferably, in one embodiment, the outer contour shapes of the concave plate flange 412 and the second annular receiving groove 130 and the pattern shape of the protrusion 413 may all be circular, such that the uniformity of the force between the concave plate flange 412 and the second annular receiving groove 130 may be improved. Also, there may be no need for angular alignment between the concave plate flange 412 and the second annular receiving groove 130, which simplifies the equipment structure and improves equipment assembly efficiency.

The present disclosure does not specifically limit how to drive the base 300 to rise and descend. For example, in one embodiment, as shown in FIG. 4, a lift drive assembly 510 may be provided at the bottom of the semiconductor process chamber. The lift drive assembly 510 may drive the base 300 to rise through the lifting shaft 520. Optionally, as shown in FIG. 4, the lifting drive assembly 510 may include a guide rail-slider device. The guide rail may extend vertically and may be fixed at the bottom of the process chamber. The slider may be movably arranged on the guide rail and connected with the bottom end of the lifting shaft 520. The slider may reciprocate vertically on the guide rail to drive the lifting shaft 520 and the base 300 connected to the top of the lifting shaft 520 to rise and descend.

To further improve the process effect of the semiconductor process in the reaction chamber 100 and maintain the cleanliness of the structure below the base 300, in one embodiment, the semiconductor process chamber may further include a purging device (not shown). As shown in FIG. 4, the purging device may be used to introduce a purging gas a into the first elastic sealing cylinder 420 through the through hole 250 at the bottom of the transfer chamber 200.

In the present embodiment, the purge device may be able to introduce the purge gas a into the first elastic sealing cylinder 420 through the through hole 250 at the bottom of the transfer chamber 200 during the semiconductor process, thereby ensuring the pressure of the gas in the lower space of the base 300 to be larger than the pressure of the process gas in the reaction zone. Therefore, the process gas may be prevented from entering the space below the base 300 to form films and particles (there is no dead space in the space between the first elastic sealing cylinder 420, the sealing ring 410 and the base 300, and the air flow is smooth from bottom to top), ensuring the cleanliness of the structural surface below the base 300. Further, the process gas may not enter the lower space of the base 300 filled with the purge gas a, thereby reducing the area that needs to be filled with the process gas. That is, the volume of the reaction area may be reduced, and the concentration of the process gas may be enhanced after a same amount of process gas enters the reaction area, thereby improving the film formation rate of the semiconductor process.

To further improve the airtightness of the lower space of the base 300, in one embodiment shown in FIG. 4, the semiconductor process chamber may further include a second elastic sealing cylinder 530, and the top end of the second elastic sealing cylinder 530 may be sealingly connected with the through hole 250 at the bottom of the transfer chamber 200. The bottom end of the second elastic sealing cylinder 530 may be sealingly connected with the bottom end of the lifting shaft 520. The purging device may be connected with the bottom end of the second elastic sealing cylinder 530 and may introduce the purge gas a to the through hole 250 at the bottom of the transfer chamber 200 through the second elastic sealing cylinder 530.

In one embodiment, as shown in FIG. 4 and FIG. 6, an exhaust passage 110 may be provided on the outside of the reaction chamber 100, and an exhaust hole may be formed on the side wall of the reaction chamber 100. The reaction chamber 100 may be connected to the exhaust passage through the exhaust hole. The height of the exhaust hole may be higher than the process position of the base 300.

In the present embodiment, the exhaust passage 110 may be provided on the outside the reaction chamber 100. The exhaust passage 110 may be connected to the reaction chamber 100 through the exhaust hole, and may be connected to an external vacuum pump through a first vacuum port 120, to pump out the reaction waste gas and the purge gas a entering the reaction area from the reaction chamber (the gas flow direction is shown in the direction of the arrow in FIG. 4).

To improve the uniformity of exhaust from the reaction chamber 100 to the exhaust passage 110 through the exhaust hole and thereby improve the uniformity of the semiconductor process, in one embodiment, the exhaust passage 110 may be arranged around the reaction chamber 100 in the horizontal direction, and a plurality of exhaust holes may be formed on the side wall of the reaction chamber 100. The plurality of exhaust holes may be evenly distributed in the circumferential direction.

In one embodiment, as shown in FIG. 4 and FIG. 6, a second vacuum port 230 may be further formed on the bottom wall of the transfer chamber 200. The transfer chamber 200 may be connected to an external vacuum pump through the second vacuum port 230, such that the sealing cylinder external space 220 may be evacuated when the semiconductor process is performed in the reaction chamber 100.

Figure 7:
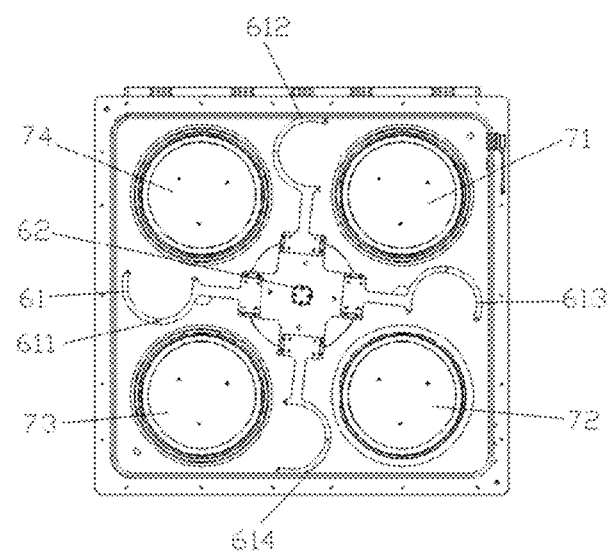
FIG. 7 illustrates a schematic diagram of the relative positional relationship between a transfer manipulator and bases of multiple process chambers in semiconductor process equipment according to various disclosed embodiments of the present disclosure.

In some embodiments, as shown in FIG. 5 and FIG. 7, the semiconductor process chamber may include a plurality of reaction chambers 100. Each reaction chamber 100 may be connected to the transfer chamber 200 through a bottom opening. A transfer manipulator 600 may be provided in the transfer chamber for transferring wafers between bases 300 corresponding to different reaction chambers 100.

In one embodiment, each reaction chamber 100 may be strictly sealed by the sealing ring 410 and the first elastic sealing cylinder 420, thereby solving the problem of mutual interference of gas flows between different reaction chambers 100 and improving the film-forming quality in each reaction chamber 100 (by experimentally evacuating the transfer chamber 200 and monitoring the pressure in the transfer chamber 200, the pressure rise rate of the gas pressure in the transfer chamber 200 is very small (less than 5 mtorr/min), that is, the sealing effect between the transfer chamber 200 and the reaction chamber 100 is effectively improved).

In one embodiment, the transfer manipulator 600 may transfer wafers between the bases 300 of different process chambers, such that an external manipulator may only transfer wafers to a portion of the base 300 in the transfer chamber 200 through the transfer port 240 of the transfer chamber 200 or take the wafers from the part of the bases 300 (carrying out the wafer pick-and-place operation), simplifying the positioning and transfer actions of the bases 300 at different positions after the external manipulator reaches into the transfer chamber 200 and improving the stability of wafer positions.

In one embodiment, a manipulator through hole may be formed on the bottom wall of the transfer chamber 200 (the plurality of reaction chambers 100 share one transfer chamber 200). The transfer manipulator 600 may include a drive assembly and an upper flange 62. The top end of the output shaft of the drive assembly may pass through the manipulator through hole and may be fixedly connected to the upper end flange 62. A plurality of bases 300 corresponding to the plurality of reaction chambers 100 may be arranged around the transfer manipulator 600, transfer fingers 61 (including a first transfer finger 611, a second transfer finger 612, a third transfer finger 613, a third transfer finger 613, and a fourth transfer finger 614) may be fixedly provided on the upper end flange 62. The driving assembly may be used to drive the upper flange 62 and the transfer fingers 61 fixed thereon to perform lifting and rotation movements (around the axis of the output shaft), such that the transfer fingers 61 remove wafers on the portion of the bases 300 and place the wafers on other bases 300. In one embodiment, as shown in FIG. 7, the semiconductor process chamber may include four reaction chambers 100 corresponding to four bases 300 (including the first base 71, the second base 72, the third base 73, and the fourth base 74) arranged at equal intervals around the circumferential direction of the transfer manipulator 600.

In one embodiment, the external manipulator may only perform wafer picking and placing operations on two bases 300 (for example, the first base 71 and the fourth base 74), and the transfer manipulator 600 may transfer wafers to the other two bases 300 (for example, the second base 742 and the third base 73).

To facilitate the understanding of those skilled in the art, a specific embodiment using the semiconductor process chamber provided by the present disclosure to perform semiconductor processing will be described below.

Before the semiconductor process starts, the four bases 300 may all be in the low position.

Wafers 700 may be transferred from outside the process chamber to the top of the first base 71 and the fourth base 74 through the transfer port 240, and then drop to the upper end surface of the plurality of support pillars 310 corresponding to the first base 71 and the fourth base 74 respectively. The driving assembly of the transfer manipulator 600 may drive the upper flange 62 to rise to a predetermined height and rotate clockwise until the first transfer finger 611 and the second transfer finger 612 rotate to positions below the wafers 700 carried by the fourth base 74 and the first base 71 respectively.

The driving assembly of the transfer manipulator 600 may drive the upper flange 62 to rise again, such that the first transfer fingers 611 and the second transfer fingers 612 lift up the wafers 700 on the first base 71 and the fourth base 74 respectively.

Subsequently, the upper flange 62 may be driven to rotate 180° clockwise, such that the first transfer finger 611 and the second transfer finger 612 are rotated to be positioned above the second base 72 and the third base 73 respectively. The upper flange 62 may be driven to descend, such that the first transfer finger 611 and the second transfer finger 612 place the wafers 700 on the upper end surface of the plurality of support pillars 310 of the second base 72 and the third base 73 respectively.

The transfer manipulator 600 may rotate counterclockwise to a certain angle such that it is hidden in the space between the bases 300.

The two wafers 700 may be transferred again to the top of the first base 71 and the fourth base 74 respectively. The first base 71, the second base 72, the third base 73, and the fourth base 74 may be driven by their respective lift drive assemblies 510 to rise. The first elastic sealing cylinder 420 may extend under its own elastic force to cause the sealing ring 410 to rise until the concave plate flange 412 of the sealing ring 410 enters the second annular receiving groove 130 of the reaction chamber 100.

The bases 300 may further rise to the process position and may be separated from the corresponding sealing rings 410. The bases 300 may continue to rise to the required process position. When the semiconductor process is performed in the reaction chambers 100, the purge component may introduce the purge gas a through the through hole 250 at the bottom of the transfer chamber 200. At the same time, the transfer chamber 200 may be exhausted through the second vacuum port 230, and the vacuum pump may extract the gas in the reaction area through the first vacuum port 120, to ensure that the pressure below the bases 300 to be larger than the pressure above the bases 300. Therefore, during the process, the process gas may not enter the transfer chamber, thereby eliminating the source of particles.

After the process is completed, the lifting drive assemblies 510 may drive the bases 300 to descend to a lower position, and the wafer 700 may be lifted up by the plurality of support pillars 310 and separated from the upper surfaces of the bases 300 in preparation for being taken out from the wafer.

The wafers 700 on the first base 71 and the fourth base 74 may be removed and transferred out of the semiconductor process chamber through the transfer port 240 first.

Subsequently, the driving assemblies may drive the upper flange 62 to rotate clockwise until the two transfer fingers 61 rotate to the positions below the wafers 700 located above the second base 72 and the third base 73. The driving assemblies may drive the upper flange 62 to drive the two transfer fingers 61 to rise and lift up the wafers 700 above the second base 72 and the third base 73 respectively. Then the upper flange 62 may rotate 180° clockwise, and then descend, to place the two wafers 700 on the first base 71 and the fourth base 74 respectively. Then the wafers 700 on the first base 71 and the fourth base 74 may be removed and transferred out of the semiconductor process chamber through the transfer port 240.

The above steps may be performed cyclically to group the wafers (four wafers form one group when the semiconductor process chamber includes four reaction chambers 100) for processing, to achieve efficient production.

Another aspect of the present disclosure provides semiconductor process equipment, including any semiconductor process chamber provided by various embodiments of the present disclosure. By adopting any semiconductor process chamber provided by various embodiments of the present disclosure, the semiconductor process equipment provided by the present disclosure may have any advantages of the semiconductor process chamber.

Figure 9:
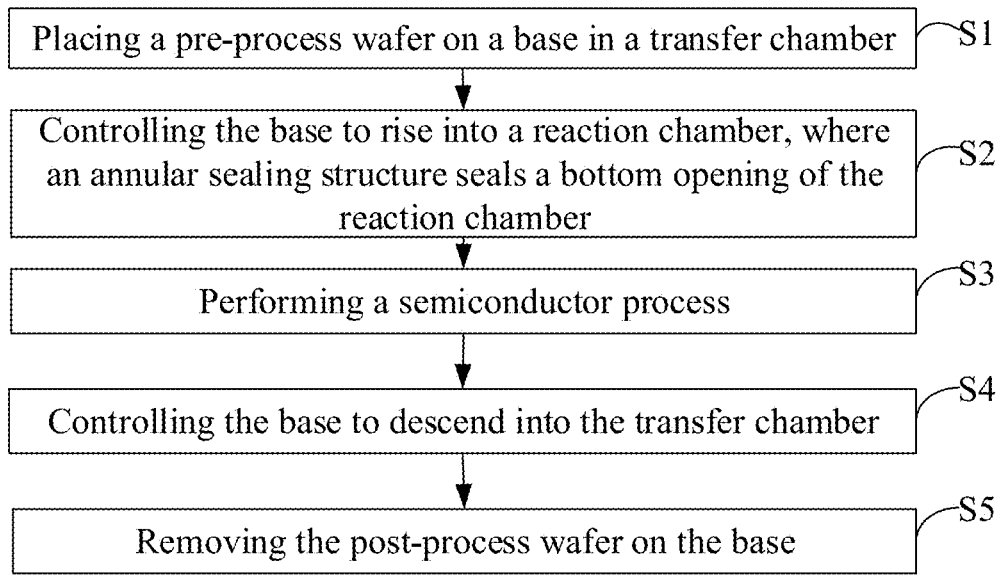
FIG. 9 illustrates a flowchart of an exemplary semiconductor process method according to various disclosed embodiments of the present disclosure.

Another aspect of the present disclosure provides a semiconductor process method. The semiconductor process method may be applied to any semiconductor process chamber provided by various embodiments of the present disclosure. As shown in FIG. 9, in one embodiment, the method may include:

S1: placing a pre-process wafer 700 on a base 300 in a transfer chamber 200;
S2: controlling the base 300 to rise into a reaction chamber 100, during which an annular sealing structure 400 seals a bottom opening of the reaction chamber 100;
S3: carrying out the semiconductor process;
S4: controlling the base 300 to descend into the transfer chamber 700; and
S5: removing the post-process wafer 700 on the base 300.

In the present disclosure, the annular sealing structure 400 (for example, including a sealing ring 410 and a first elastic sealing cylinder 420) may isolate the reaction chamber 100 and the sealing cylinder internal space 210 from the sealing cylinder external space 220, thereby improving the sealing effect of the reaction chamber 100 and improving the pressure control effect of the reaction chamber 100. The process effect of the semiconductor process may be also improved. Further, to ensure the cleanliness of the wafer surface, the transfer chamber 200 may need to be evacuated before each wafer transfer. In the present disclosure, there may be strict isolation between devices such as manipulators in the sealing cylinder external space 220 and the reaction chamber 100. Therefore, the sealing cylinder external space 220 may be able to be evacuated while the semiconductor process is being carried out in the reaction chamber 100, and there may be no need to evacuate the transfer chamber 200 to the background vacuum again during the wafer transfer step between different semiconductor processes. The wafer transfer time may be shortened, thereby improving the film forming efficiency of the semiconductor process and increasing the machine productivity. Also, the semiconductor process chamber structure provided by the present disclosure may be particularly suitable for a multi-reaction-zone chamber (that is, there are multiple reaction chambers 100 in a same semiconductor process chamber, and the multiple reaction chambers 100 are connected to the same transfer chamber 200 below). As shown in FIG. 5, the sealing ring 410 and the first elastic sealing cylinder 420 may strictly seal the reaction chamber 100, thereby solving the problem of mutual gas flow interference between the various reaction zones (reaction chambers) in the multi-reaction-zone chamber and improving the film formation quality of the multi-reaction-zone chamber.

To further improve the process effect of the semiconductor process in the reaction chamber 100 and maintain the cleanliness of the structure below the base 300, in one embodiment, the semiconductor process chamber may further include a purging device (not shown). As shown in FIG. 4, the purging device may be used to introduce a purging gas a into the first elastic sealing cylinder 420 through the through hole 250 at the bottom of the transfer chamber 200.

S3 may further include: when carrying out the semiconductor process, controlling the purging device to introduce the purge gas a into the first elastic sealing cylinder 420.

In the present embodiment, the purge device may be able to introduce the purge gas a into the first elastic sealing cylinder 420 through the through hole 250 at the bottom of the transfer chamber 200 during the semiconductor process, thereby ensuring the pressure of the gas in the lower space of the base 300 to be larger than the pressure of the process gas in the reaction zone. Therefore, the process gas may be prevented from entering the space below the base 300 to form films and particles (there is no dead space in the space between the first elastic sealing cylinder 420, the sealing ring 410 and the base 300, and the air flow is smooth from bottom to top), ensuring the cleanliness of the structural surface below the base 300. Further, the process gas may not enter the lower space of the base 300 filled with the purge gas a, thereby reducing the area that needs to be filled with the process gas. That is, the volume of the reaction area may be reduced, and the concentration of the process gas may be enhanced after a same amount of process gas enters the reaction area, thereby improving the film formation rate of the semiconductor process.

To simplify positioning and transferring actions of an external manipulator after being inserted into the transfer chamber 200 and improve the stability of the position of the wafer 700, in one embodiment, as shown in FIG. 5 and FIG. 7, the semiconductor process chamber may include a plurality of reaction chambers 100. A transfer manipulator 600 may be provided in the transfer chamber 200 for transferring wafers between bases 300 corresponding to different reaction chambers 100.

Figure 10:
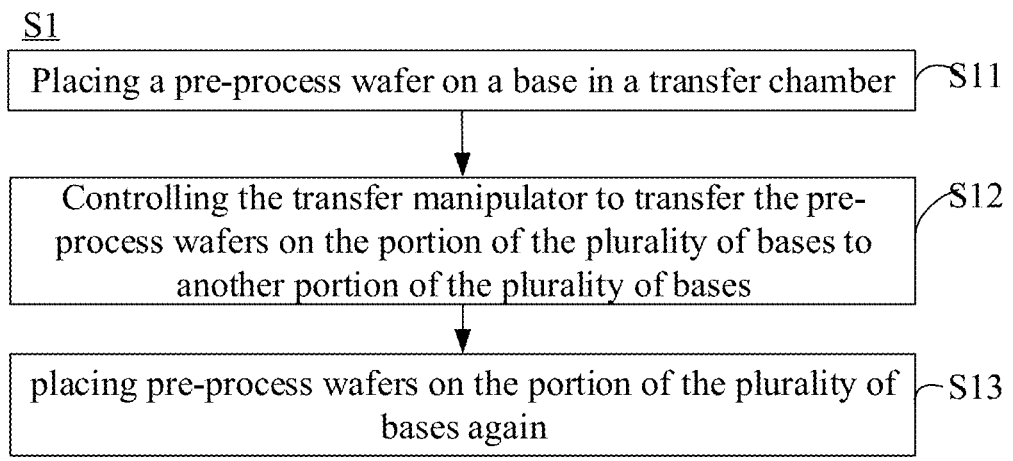
FIG. 10 illustrates a flowchart of a portion of an exemplary semiconductor process method according to various disclosed embodiments of the present disclosure.

As shown in FIG. 10, placing the pre-process wafer 700 on the base 300 in S1 may include:

S11: placing pre-process wafers 700 on a portion of the bases 300;

S12: controlling the transfer manipulator 600 to transfer the pre-process wafers 700 on the portion of the bases 300 to another portion of the bases 300; and S13: placing pre-process wafers 700 on the portion of the bases 300 again.

Figure 11:
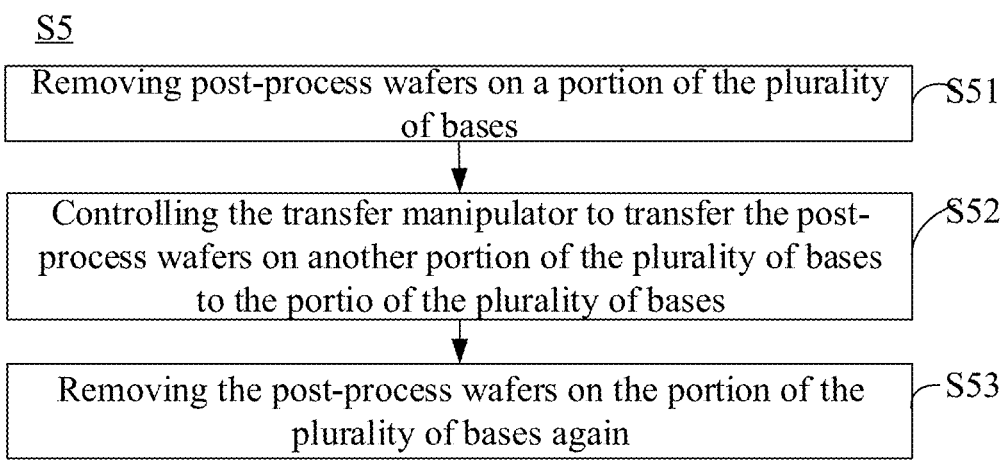
FIG. 11 illustrates a flowchart of a portion of an exemplary semiconductor process method according to various disclosed embodiments of the present disclosure.

Correspondingly, as shown in FIG. 11, removing the post-process wafer 700 on the base 300 in S5 may include:

S51: removing post-process wafers 700 on a portion of the bases 300;

S52: controlling the transfer manipulator 600 to transfer post-process wafers 700 on another portion of the bases 300 to the portion of the bases 300; and S53: removing the post-process wafers 700 on the portion of the bases 300 again.

In one embodiment, a manipulator through hole may be formed on the bottom wall of the transfer chamber 200. The transfer manipulator 600 may include a drive assembly and an upper flange 62. The top end of the output shaft of the drive assembly may pass through the manipulator through hole and may be fixedly connected to the upper end flange 62. The plurality of bases 300 corresponding to the plurality of reaction chambers 100 may be arranged around the transfer manipulator 600, transfer fingers 61 (including a first transfer finger 611, a second transfer finger 612, a third transfer finger 613, a third transfer finger 613, and a fourth transfer finger 614) may be fixedly provided on the upper end flange 62. The driving assembly may be used to drive the upper flange 62 and the transfer fingers 61 fixed thereon to perform lifting and rotation movements (around the axis of the output shaft), such that the transfer fingers 61 remove wafers on the portion of the bases 300 and place the wafers on other bases 300.

Correspondingly, controlling the transfer manipulator 600 to transfer the pre-process wafers 700 on the portion of the bases 300 to another portion of the bases 300 in S12 may include:

S121: controlling the driving assembly to drive the upper flange 62 to rise or descend, such that the height of the transfer fingers 61 rises or descends to a position between the pre-process wafer 700 and the bearing surface of the bases 300;

S122: controlling the driving assembly to drive the upper flange 62 to rotate, such that at least a portion of the transfer fingers 61 is rotated to a position below the pre-process wafers 700 on the portion of the bases 300 (for example, in the case where the semiconductor process chamber shown in FIG. 7 includes four reaction chambers 100, the portion of the bases 300 may be the first base 71 and the fourth base 74), and controlling the driving assembly to drive the upper flange 62 to rise, such that the transfer fingers 61 remove the pre-process wafers 700 on the portion of the bases 300 (the first base 71 and the fourth base 74);

S123: controlling the driving assembly to drive the upper flange 62 to rotate, such that the pre-process wafers 700 on the transfer fingers 61 may be rotated to positions above other bases 300 (the second base 72 and the third base 73), and controlling the driving assembly to drive the upper flange 62 to descend, such that the transfer fingers 61 place the pre-process wafers 700 on the other bases 300; and S124: controlling the drive assembly to drive the upper flange 62 to rotate, such that the transfer fingers 61 leave the bases 300.

Correspondingly, controlling the transfer manipulator 600 to transfer the post-process wafers 700 on the other bases 300 to the portion of the bases 300 in S52 may include:

S521: controlling the driving assembly to drive the upper flange 62 to rise or descend, such that the height of the transfer fingers 61 rises or descends to a position between the post-process wafer 700 and the bearing surface of the bases 300;

S522: controlling the driving assembly to drive the upper flange 62 to rotate, such that at least a portion of the transfer fingers 61 is rotated to a position below the post-process wafers 700 on the other bases 300 (the second base 72 and the third base 73), and controlling the driving assembly to drive the upper flange 62 to rise, such that the transfer fingers 61 remove the post-process wafers 700 on the other bases 300;

S523: controlling the driving assembly to drive the upper flange 62 to rotate, such that the post-process wafers 700 on the transfer fingers 61 may be rotated to positions above the portion of the bases 300 (the first base 71 and the fourth base 74), and controlling the driving assembly to drive the upper flange 62 to descend, such that the transfer fingers 61 place the post-process wafers 700 on the portion of the bases 300; and S524: controlling the drive assembly to drive the upper flange 62 to rotate, such that the transfer fingers 61 leave the bases 300.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor process chamber, comprising:
a reaction chamber;
a transfer chamber located below the reaction chamber, wherein the reaction chamber is connected to the transfer chamber through a bottom opening;
a base with a lifting shaft connected to a bottom of the base, wherein the base is able to rise and descend between the reaction chamber and the transfer chamber through the bottom opening;
a sealing ring; and
a first elastic sealing cylinder;
wherein:
the sealing ring and the first elastic sealing cylinder are disposed below the base and surrounding the lifting shaft of the base;
a top end of the first elastic sealing cylinder is sealingly connected to a bottom wall of the sealing ring in an inner hole of the sealing ring;
a bottom end of the first elastic sealing cylinder is sealingly connected to the bottom wall of the transfer chamber at a through-hole of the bottom of the transfer chamber for the lifting shaft to pass through; and when the base rises into the reaction chamber the first elastic sealing cylinder drives the sealing ring to rise through an elastic force and seal the bottom opening of the reaction chamber.

2. The semiconductor process chamber according to claim 1, wherein:
the first elastic sealing cylinder is a bellows.

3. The semiconductor process chamber according to claim 1, wherein:
the bottom end of the first elastic sealing cylinder is provided with a connecting flange;
a first annular receiving groove surrounding the through hole is formed on the bottom wall of the transfer chamber; and
the connecting flange is disposed in the first annular receiving groove.

4. The semiconductor process chamber according to claim 1, wherein:
the sealing ring includes a concave plate and a concave plate flange;
the concave plate flange is arranged around the concave plate and fixedly connected to an outer edge of the concave plate;
the concave plate flange is used to abut against the bottom wall of the reaction chamber; and
a side of the concave plate facing the reaction chamber is provided with a receiving groove for accommodating the base when the base is lowered.

5. The semiconductor process chamber according to claim 4, wherein:
the bottom wall of the reaction chamber is provided with a second annular receiving groove surrounding the bottom opening; and
the second annular receiving groove is used to accommodate the concave plate flange.

6. The semiconductor process chamber according to claim 1, wherein:
the base includes a plurality of base holes distributed at intervals along a circumferential direction of the base;
a plurality of support pillars is disposed in the plurality of base holes in one-to-one correspondence;
the support pillars are configured to descend along the base holes relative to the base when the base rises and rise together with the base after the tops of the support pillars are flush with the bearing surface of the base; and
after the base descends to bottom ends of the support pillars and contacts the bottom wall of the transfer chamber, the support pillars support and lift the wafter on the base;
the first elastic sealing cylinder surrounds at outerside of the plurality of support pillars.

7. The semiconductor process chamber according to claim 1, wherein:
the semiconductor process chamber includes a plurality of the reaction chambers;
each reaction chamber includes one corresponding bottom opening and is communicated with the transfer chamber through the bottom opening;
the semiconductor process chamber includes a plurality of the bases whose number is same as the number of the plurality of the reaction chambers, and the plurality of the bases and the plurality of the reaction chambers are disposed in one-to-one correspondence; and
a transfer manipulator is provided in the transfer chamber to transfer wafers between bases corresponding to different reaction chambers.

8. The semiconductor process chamber according to claim 7, wherein:
the plurality of bases corresponding to the plurality of the reaction chambers are arranged around the transfer manipulator;
the transfer manipulator includes a driving assembly, an upper flange, and transfer fingers fixedly provided on the upper flange;
the driving assembly is used to drive the upper flange and the transfer fingers fixed on the upper flange to lift or rotate, such that the transfer fingers are able to remove wafers on a portion of the plurality of bases and place the wafers on another portion of the plurality of bases.

9. A semiconductor process method applied to semiconductor process equipment comprising:
placing a pre-process wafer on a base in a transfer chamber;
controlling the base to rise into a reaction chamber, wherein an annular sealing structure seals a bottom opening of the reaction chamber;
performing a semiconductor process;
controlling the base to descend into the transfer chamber; and
removing the post-process wafer on the base;
wherein the semiconductor process equipment includes a semiconductor process chamber, including:
the reaction chamber;
the transfer chamber located below the reaction chamber, wherein the reaction chamber is connected to the transfer chamber through the bottom opening;
he base with a lifting shaft connected to a bottom of the base, wherein the base is able to rise and descend between the reaction chamber and the transfer chamber through the bottom opening;
the annular sealing structure including a sealing ring and a first elastic sealing cylinder;
wherein:
the sealing ring and the first elastic sealing cylinder are disposed below the base and surrounding the lifting shaft of the base;
a top end of the first elastic sealing cylinder is sealingly connected to a bottom wall of the sealing ring in an inner hole of the sealing ring;
a bottom end of the first elastic sealing cylinder is sealingly connected to the bottom wall of the transfer chamber at a through-hole of the bottom of the transfer chamber for the lifting shaft to pass through; and
when the base rises into the reaction chamber the first elastic sealing cylinder drives the sealing ring to rise through an elastic force and seal the bottom opening of the reaction chamber.

10. The semiconductor process method according to claim 9, wherein:
the semiconductor process equipment includes a plurality of reaction chambers; and
a transfer manipulator is provided in the transfer chamber to transfer wafers between bases corresponding to different reaction chambers;
the method further comprising:
placing the pre-process wafer on the base in the transfer chamber includes:
placing pre-process wafers on a portion of the plurality of bases;

controlling the transfer manipulator to transfer the pro-process wafers on the portion of the plurality of bases to another portion of the plurality of bases; and placing pre-process wafers on the portion of the plurality of bases again; and removing the post-process wafer on the base includes:
removing post-process wafers on a portion of the plurality of bases;
controlling the transfer manipulator to transfer the post-process wafers on another portion of the plurality of bases to the portion of the plurality of bases; and
removing the post-process wafers on the portion of the plurality of bases again.

11. The semiconductor process method according to claim 10,
wherein:
a plurality of bases corresponding to the plurality of reaction chambers are arranged around the transfer manipulator; and
the transfer manipulator includes a driving assembly, an upper flange and transfer fingers fixedly provided on the upper flange;
the method further comprising:
controlling the transfer manipulator to transfer the pro-process wafers on the portion of the plurality of bases to the another portion of the plurality of bases including:
controlling the driving assembly to drive the upper flange to rise or descend, such that the height of the transfer fingers rises or descends between the pre-process wafers and the bearing surface of the plurality of bases;
controlling the driving assembly to drive the upper flange to rotate, such that at least a portion of the transfer fingers rotates to positions below the pre-process wafers on the portion of the plurality of bases, and controlling the driving assembly to drive the upper flange to rise, such that the transfer fingers remove the pre-process wafers on the portion of the plurality of bases;
controlling the driving assembly to drive the upper flange to rotate such that the pre-process wafers carried on the transfer fingers are rotated to positions above the another portion of the plurality of bases, and controlling the driving assembly to drive the upper flange to descend, such that the transfer fingers place the pre-process wafers on the another portion of the plurality of bases; and
controlling the driving assembly to drive the upper flange to rotate, such that the transfer fingers leave the plurality of bases, and
controlling the transfer manipulator to transfer the post-process wafers on the another portion of the plurality of bases to the portion of the plurality of bases including:
controlling the driving assembly to drive the upper flange to rise or descend, such that the height of the transfer fingers rises or descends between the post-process wafers and the bearing surface of the plurality of bases;
controlling the driving assembly to drive the upper flange to rotate, such that at least a portion of the transfer fingers rotates to positions below the post-process wafers on the another portion of the plurality of bases, and controlling the driving assembly to drive the upper flange to rise, such that the transfer fingers remove the post-process wafers on the another portion of the plurality of bases;
controlling the driving assembly to drive the upper flange to rotate such that the post-process wafers carried on the transfer fingers are rotated to positions above the portion of the plurality of bases, and controlling the driving assembly to drive the upper flange to descend, such that the transfer fingers place the post-process wafers on the portion of the plurality of bases; and
controlling the driving assembly to drive the upper flange to rotate, such that the transfer fingers leave the plurality of bases.

* * * * *